(12) United States Patent
Kidoh et al.

(10) Patent No.: US 7,459,741 B2
(45) Date of Patent: Dec. 2, 2008

(54) SEMICONDUCTOR MEMORY DEVICE

(75) Inventors: Masaru Kidoh, Kawasaki (JP); Hideaki Aochi, Kawasaki (JP); Ryota Katsumata, Yokohama (JP); Masaru Kito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 11/390,255

(22) Filed: Mar. 28, 2006

(65) Prior Publication Data
US 2007/0164340 A1 Jul. 19, 2007

(30) Foreign Application Priority Data
Jan. 17, 2006 (JP) .............................. 2006-008830

(51) Int. Cl.
*H01L 29/34* (2006.01)
(52) U.S. Cl. ........................ 257/296; 257/297; 257/298; 257/299; 257/310; 257/311; 257/312; 257/313; 257/314; 257/315; 257/316
(58) Field of Classification Search .......... 257/296–316
See application file for complete search history.

(56) References Cited
U.S. PATENT DOCUMENTS

| | | | |
|---|---|---|---|
| 5,942,778 A * | 8/1999 | Oikawa | 257/301 |
| 6,700,150 B1 * | 3/2004 | Wu | 257/296 |
| 6,759,702 B2 | 7/2004 | Radens et al. | |
| 2004/0061161 A1 * | 4/2004 | Radens et al. | 257/301 |
| 2005/0141262 A1 * | 6/2005 | Yamada et al. | 365/149 |
| 2005/0196932 A1 * | 9/2005 | Divakaruni et al. | 438/389 |

FOREIGN PATENT DOCUMENTS

| | | |
|---|---|---|
| JP | 2002-26147 | 1/2002 |
| JP | 2004-335031 | 11/2004 |

* cited by examiner

*Primary Examiner*—Cuong Q Nguyen
*Assistant Examiner*—Trang Q Tran
(74) *Attorney, Agent, or Firm*—Oblon, Spivak, McClelland, Maier & Neustadt, P.C.

(57) ABSTRACT

A semiconductor memory device excellent in data holding characteristics even when a cell area is reduced is disclosed. According to one aspect of the present invention, a semiconductor memory device comprises a transistor including a source, a drain and a channel region disposed in a semiconductor substrate, and including a gate electrode disposed through a gate insulator on a surface of the semiconductor substrate of the channel region, a capacitor connected to the channel region, a first wiring line electrically connected to the gate electrode, and a second wiring line electrically connected to the drain.

20 Claims, 5 Drawing Sheets

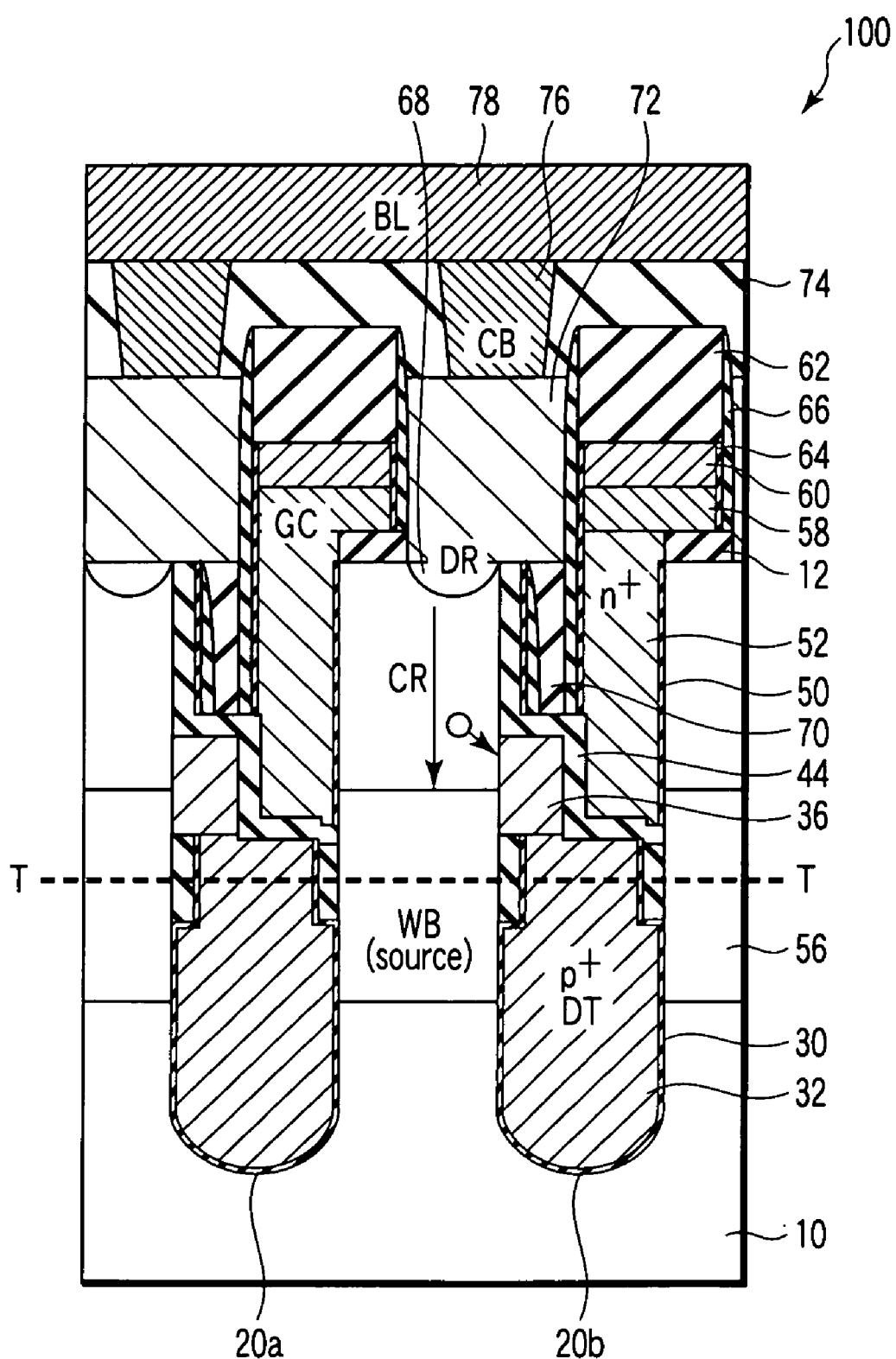
F I G. 2

SEMICONDUCTOR MEMORY DEVICE

CROSS-REFERENCE TO RELATED APPLICATIONS

This application is based upon and claims the benefit of priority from prior Japanese Patent Application No. 2006-008830, filed Jan. 17, 2006, the entire contents of which are incorporated herein by reference.

BACKGROUND OF THE INVENTION

1. Field of the Invention

The present invention relates to a semiconductor memory device, and more particularly to a semiconductor memory device which includes a trench capacitor.

2. Description of the Related Art

In the semiconductor memory device, a gate electrode and an active area of an array transistor of a memory cell, e.g., a source, a drain, and a channel region, are formed to be planar in a surface of a semiconductor substrate. In a dynamic random memory (DRAM), for example, a size of one memory cell is $8F^2$ or $6F^2$ in most cases. Where, F denotes a critical dimension of a lithography technology used. Thus, in the semiconductor memory device, progress has been made in reductions of a cell size and a chip size by shrinking critical dimensions.

However, as shrinking the critical dimensions, a gate length of the transistor also decreases, therefore deterioration occurs in cut-off characteristics of the array transistor.

To achieve a high density semiconductor memory device, a memory cell structure that uses a vertical transistor is disclosed in Jpn. Pat. Appln. KOKAI Publication No. 2002-2614. According to this structure, a storage capacitor having an n-type polysilicon is formed in a bottom of a deep trench formed in a semiconductor substrate, and a gate electrode of the vertical transistor is disposed in its upper trench. A source, a channel region, and a drain of the vertical transistor are vertically disposed side by side in the semiconductor substrate of one side face of the trench facing the gate electrode. Hence, a size of the memory cell is reduced to $6F^2$. However, such a memory cell has a process problem that a deep trench must be formed. Additionally, further progress in miniaturization causes a problem that holes are accumulated in the channel region to destabilize the vertical transistor operation.

A memory cell of another structure that actively uses holes accumulated in a channel region is a floating body cell (referred as FBC, herein after) (see, e.g., Jpn. Pat. Appln. KOKAI Publication No. 2004-335031). The FBC memory is a memory cell which does not use a capacitor but utilizes a characteristic in which a threshold voltage of n channel transistor lowers when holes are accumulated in the channel region. The memory cell is mainly used in a semiconductor memory device using a silicon-on-insulator (SOI) substrate. In an SOI semiconductor memory device, as the channel region (body) is formed on an insulator, the channel region is inevitably set in a floating state. In the case of the FBC, it can hardly increase a storage capacity because of a limitation of an area of the channel region to store the holes.

BRIEF SUMMARY OF THE INVENTION

According to one aspect of the present invention, it is provided a semiconductor memory device comprising: a transistor including a source, a drain and a channel region disposed in a semiconductor substrate, and including a gate electrode disposed through a gate insulator on a surface of the semiconductor substrate of the channel region; a capacitor connected to the channel region; a first wiring line electrically connected to the gate electrode; and a second wiring line electrically connected to the drain.

According to another aspect of the present invention, it is provided a semiconductor memory device comprising: a plurality of trenches disposed in a semiconductor substrate; a transistor including a drain, a channel region, and a source disposed in a columnar semiconductor substrate area held between the trenches, and including a gate electrode disposed through a gate insulator on one side face of the channel region and disposed in a trench; a capacitor connected to the other side face of the channel region and disposed in another trench; a first wiring line electrically connected to the gate electrode; and a second wiring line electrically connected to the drain.

BRIEF DESCRIPTION OF THE SEVERAL VIEWS OF THE DRAWING

FIG. 2 is a diagram showing an example of a cross section of the semiconductor memory device of the embodiment cut along a bit line (BL) indicated by a cut line A-A of FIG. 1;

DETAILED DESCRIPTION OF THE INVENTION

Figure 1:
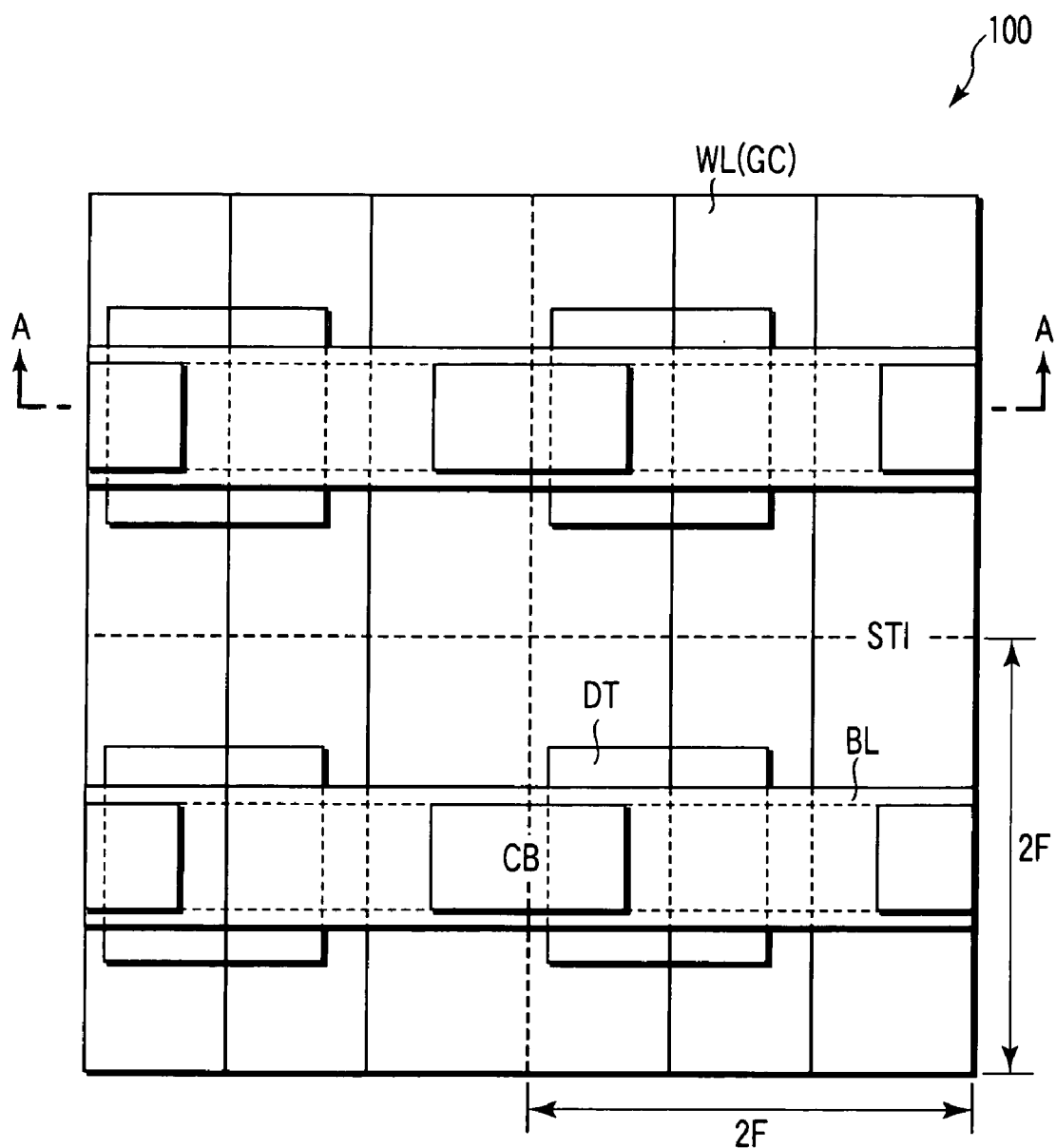
FIG. 1 is a diagram showing an example of a planar layout of a semiconductor memory device according to an embodiment of the present invention.

Embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

The present invention provides a semiconductor memory device excellent in data holding characteristics even when a cell area is reduced.

According to one embodiment of the present invention, it is provided a semiconductor memory device comprising a floating body cell (FBC) type DRAM including a vertical transistor and a capacitor connected to a channel region of the vertical transistor. The present embodiment provides a novel DRAM memory cell structure since a DRAM capacitor of a conventional art is connected to a source of a transistor. Additionally, according to the embodiment, a capacitor uses a p-type semiconductor to store positive charges, i.e., holes. In this point, it is also different from the DRAM capacitor of the conventional art which uses an n-type semiconductor to store negative charges, i.e., electrons. Referring to FIGS. 1 and 2, the semiconductor memory device of one embodiment of the present invention will be described below.

FIG. 1 shows an example of a planar layout of a semiconductor memory device 100 according to the embodiment. In FIG. 1, four memory cells are shown, a size of one unit cell is 2F vertically and horizontally, and an area is $4F^2$. Where, F denotes a critical dimension of a lithography technology used. In this memory cell, a trench capacitor (DT) is disposed below an intersection point between a word line (WL) extending in a vertical direction of FIG. 1, and a bit line (BL) extending in a horizontal direction. The trench capacitor (DT)

is formed in a bottom of a trench, and a gate electrode (GC) of a vertical transistor is formed in another trench above an adjacent trench capacitor (DT). The gate electrode (GC) is disposed in a position below the word line (WL) in the trench. Accordingly, nearly a half of a width of the word line (WL) overlaps the trench capacitor (DT) as shown in FIG. 1. A bit line contact (CB) connected to the bit line (BL) is extended over parts of two unit cell areas so that nearly a half of a bit line contact area (CB) may overlap the trench capacitor (DT). Thus, by increasing planar overlapping of constituents, a planar area of the cell is reduced to realize a unit cell area of $4F^2$.

FIG. 2 shows an example of a cross section of the semiconductor memory device 100 according to the embodiment cut along the bit line (BL) indicated by a cut line A-A of FIG. 1.

Trenches 20a, 20b are formed in a semiconductor substrate 10. In a bottom of the trench 20b, p-type polysilicon 32, 36 are buried to form a trench capacitor (DT). The trench 20 need not to be made deep as that of a capacitor in the conventional art since the trench capacitor (DT) sufficiently functions with less storage capacitance as that of the conventional capacitor. A gate electrode (GC) 52, 58 of an array transistor is formed through insulators 44 on one side face of the trench 20a and above an adjacent trench capacitors (DT). A word line (WL) including a structure of a metal 60, e.g., tungsten (W) stacked on the polysilicon 58 is formed on the gate electrode (GC).

A source (WB) 56, a channel region (CR), and a drain (DR) 68 of the array transistor are formed in nearly an upper half of the columnar p-type semiconductor substrate 10 held between the two trenches 20a, 20b. The source (WB) is formed as a buried source (WB) by burying an n-type diffusion layer in a level deep from a top surface of the semiconductor substrate 10. A p-type channel region (CR) is formed on the buried source (WB) in the columnar semiconductor substrate 10, and a drain (DR) is formed of an n-type diffusion layer in a part of the top surface of the columnar semiconductor substrate 10. The channel region (CR) is connected to the trench capacitor (DT) formed in the bottom of the trench 20b. However, it is in a floating sate without being connected to any wiring lines for controlling its potential.

A cell area is reduced by forming the array transistor as the vertical transistor which uses one side surface of the trench 20. At the same time, a gate length can be designed independently of a feature size in the surface. Although it is not shown in FIG. 2, in an area between adjacent memory cells in the word line (WL) direction, i.e., in an area indicated by STI in FIG. 1, a shallow trench isolation (STI) is formed above a level indicated a broken line T-T shown in FIG. 2. Hence, nearly an upper half of the source (WB) is isolated by STI, while its lower half is connected in the word line direction to serve as a common source line (WB) in the cell.

As described above, by increasing the overlapping of the constituents of the memory cell, the planar area of the cell is reduced to realize $4F^2$.

Figure 3A:
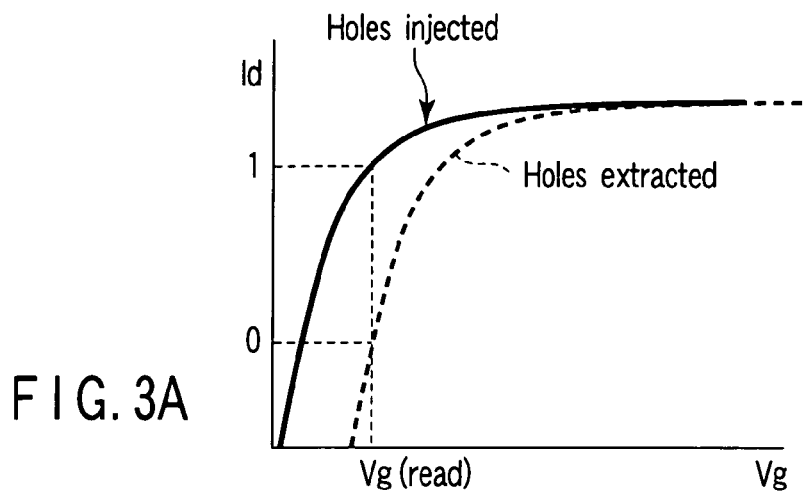
FIGS. 3A to 3C are diagrams each illustrating an example of a principle of an operation of the semiconductor memory device according to the embodiment.
Figure 3B:
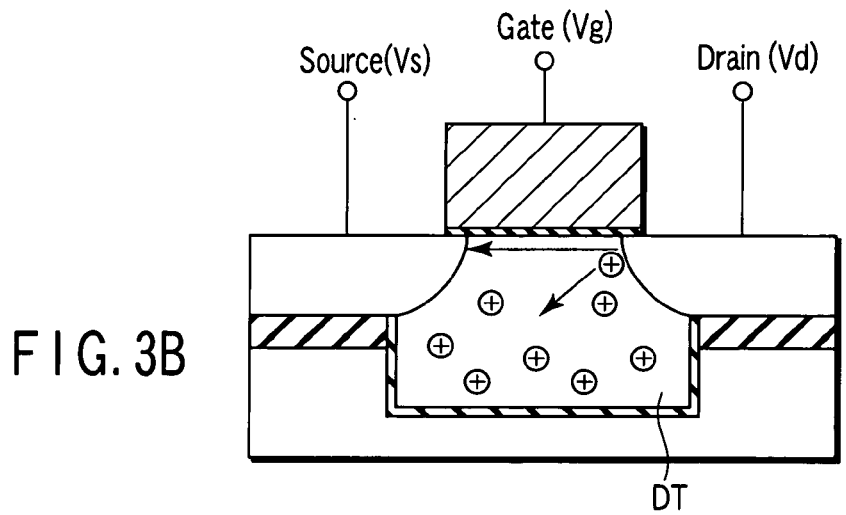
Figure 3C:
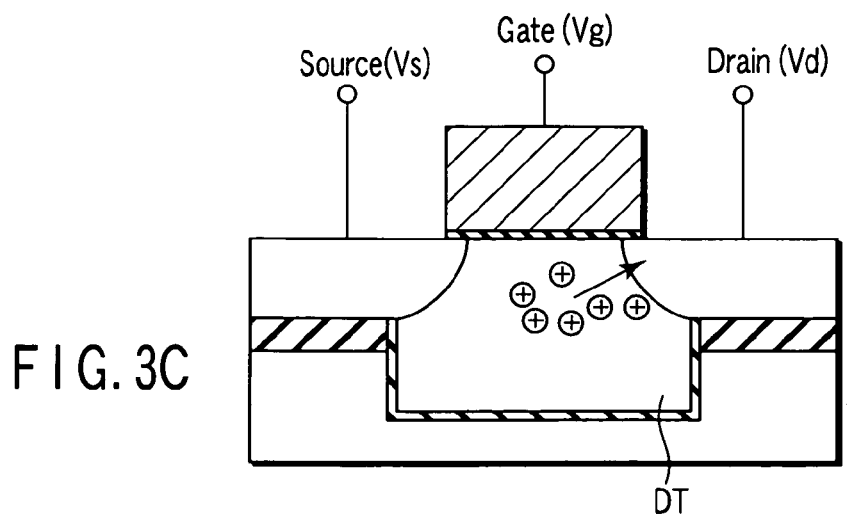

Referring to FIGS. 3A to 3C, an example of a principle of an operation of the semiconductor memory device of the embodiment will be described. As in the case of the FBC that uses the SOI substrate, the memory cell of the embodiment stores holes in the trench capacitor (DT). The holes are generated at an edge of the drain (DR) by impact ionization due to a current flowing between the source and the drain. Information of the memory cell is detected by using a change in a threshold voltage of an n channel transistor under a predetermined gate voltage is applied, as shown in FIG. 3A. If an amount of stored holes is increased, the threshold voltage lowers, thereby increasing a source-drain current (Id) of the transistor as indicated by a solid line of FIG. 3A.

An FBC type DRAM comprising a capacitor of the embodiment can increase a hole storage capacity more than that of the conventional FBC type DRAM using the SOI substrate. Thus, the threshold voltage of the memory cell transistor can be changed more than that of the conventional FBC type DRAM, thereby stabilizing an operation of the memory cell. Furthermore, an operation of the memory cell can be stabilized more than that of a conventional deep trench memory cell, which stores electrons in the capacitor to determine information of the memory cell based on a charge amount, even when a storage capacity is smaller than that of the conventional deep trench capacitor. As a result, it is not necessary to form a deep trench different from the case of the conventional type, accordingly a trench processing is facilitated.

An example of an operation of the semiconductor memory device of the embodiment will be described below. In the memory cell, a state in which holes are injected in the trench capacitor is "1", while a state in which holes are extracted from the capacitor is "0". Now, Vbl denotes a bit line voltage (=drain voltage), Vs denotes a source voltage, Vg denotes a gate voltage, and Vsub denotes a substrate voltage.

Writing of data "1" is carried out by setting, e.g., Vbl=2.3V, Vs=0V, Vg=1.5V, and Vsub=0V. Under these conditions, a current Id flowing from the source to the drain becomes large, and impact ionization occurs near a drain edge as shown in FIG. 3B. Thus generated holes are injected into the trench capacitor and accumulated to write the data "1". The Vsub may not be 0V as long as it is set not to be a forward bias with respect to the source.

Writing of data "0" is carried out by setting, e.g., Vbl=−1.5V, Vs=0V, Vg=1.5V, and Vsub=0V. Under these conditions, a pn junction between the channel region and the drain becomes a forward bias, and holes stored in the trench capacitor flow through the drain to the bit line. As a result, the holes in the trench capacitor are extracted to write the data "0".

After the writing, the data can be held by setting, for example, Vg=−1.5V, Vbl=0V, Vs=0V, and Vsub=0V.

For data reading, a condition is set to cause flowing Id small so that impact ionization can be prevented, and a value of the Id is detected to determine whether data is "1" or "0". For example, the reading conditions are Vbl=0.2V, Vs=0V, Vg=1.5V, and Vsub=0V. As shown in FIG. 3A, data is "1" if the detected Id is larger than a predetermined value, and "0" if the Id is smaller.

Next, referring to process sectional diagrams of FIGS. 4A to 4D, an example of a manufacturing process of the semiconductor memory device 100 of the embodiment will be described. The drawings show some representative process sectional diagrams alone, and shown portions are only denoted by reference numerals to be described.

Figure 4B:
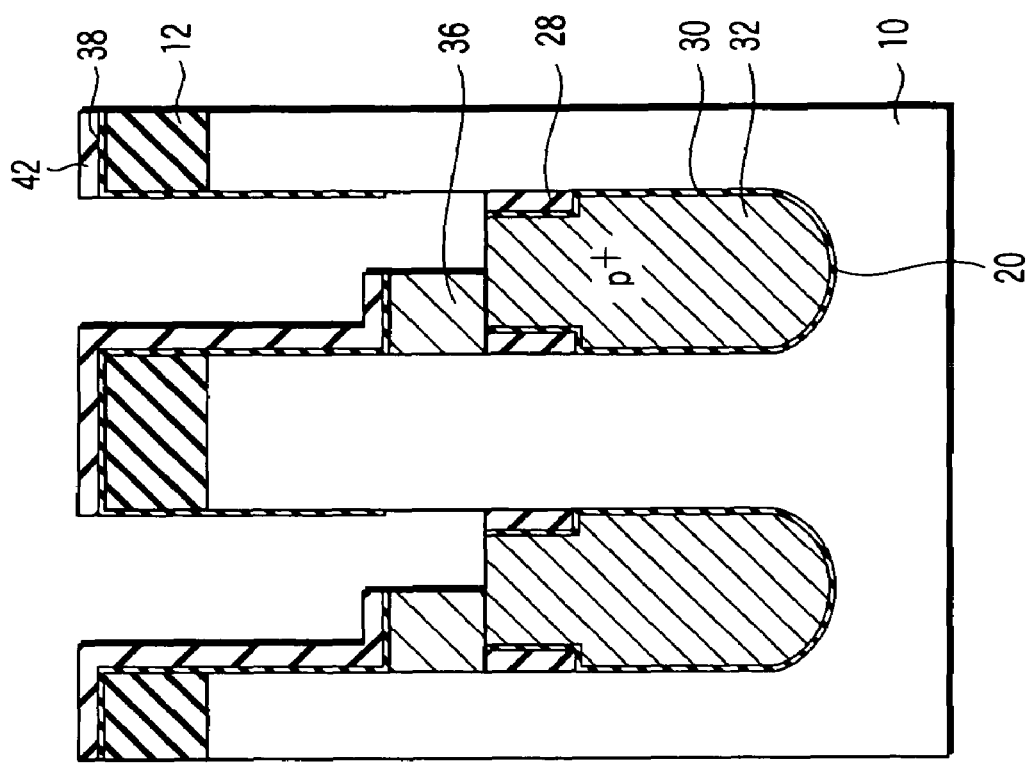
FIGS. 4A to 4D are process sectional diagrams each showing an example of a manufacturing process of the semiconductor memory device according to the embodiment.
Figure 4A:
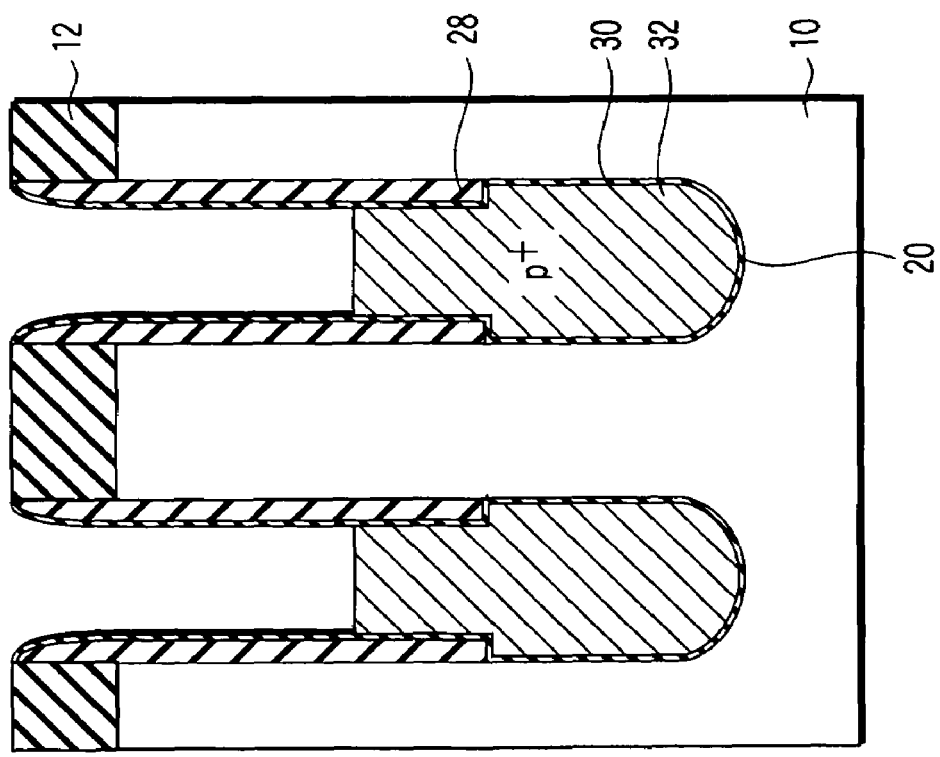
Figure 4D:
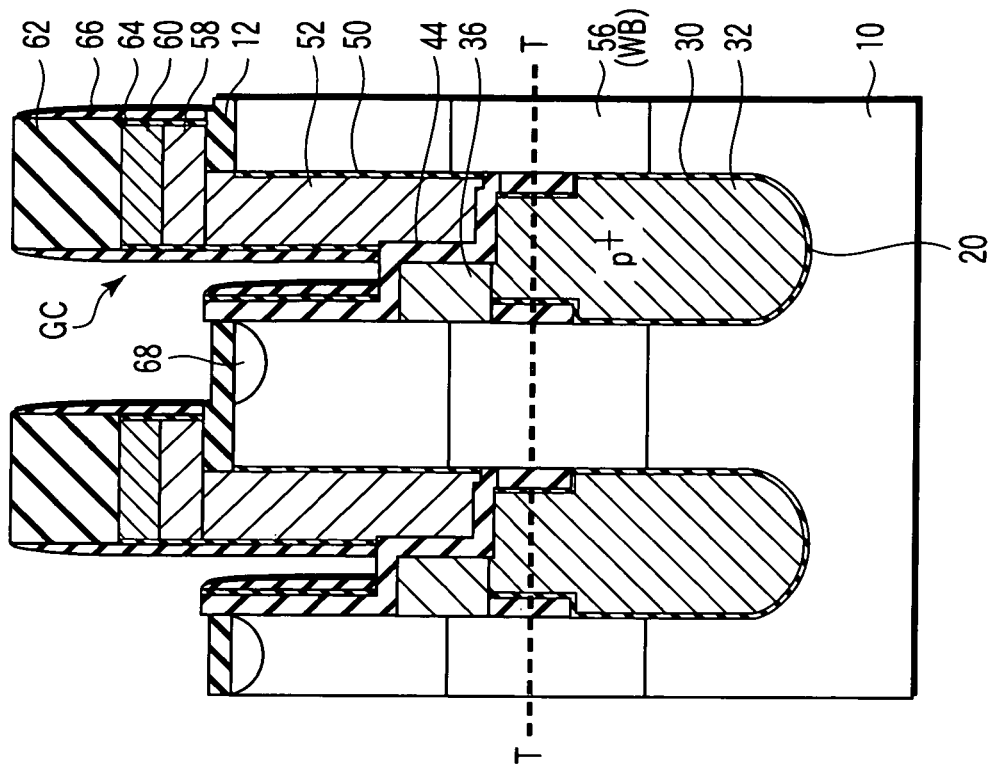
Figure 4C:
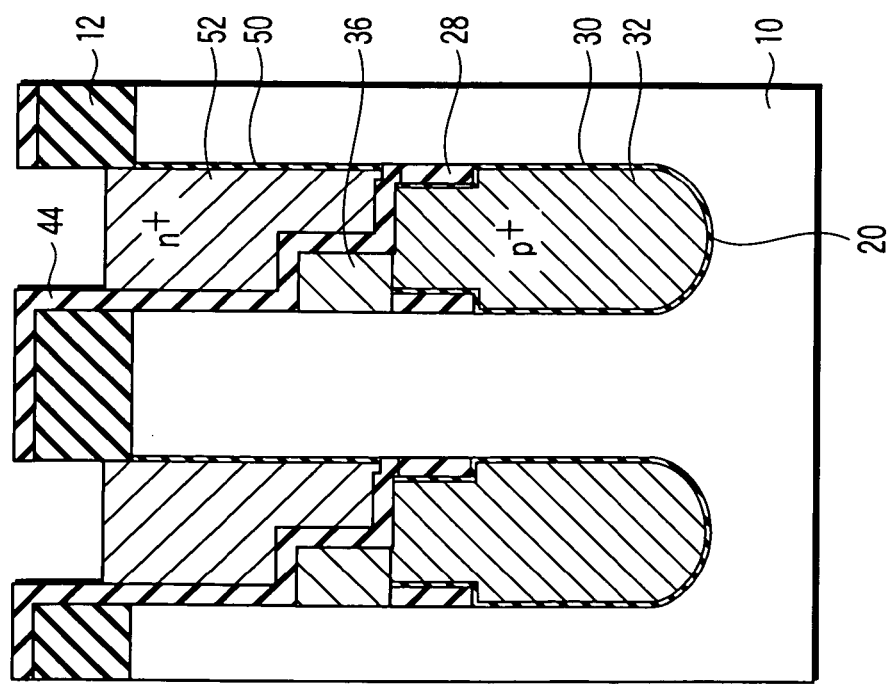

In FIG. 4A, a p-type first polysilicon 32 is buried in the bottom of the trench 20 formed in the semiconductor substrate 10 to constitute a trench capacitor (DT). The process thus far is almost similar to that of the conventional art, and it will be described briefly.

First, for example, a first silicon nitride film ($Si_3N_4$ film) 12 is deposited on an entire surface of a silicon semiconductor substrate 10 by, e.g., chemical vapor deposition (CVD). The first $Si_3N_4$ film 12 is patterned by lithography and etching to form a trench pattern for a capacitor. A trench 20 is formed with a desired depth by anisotropic etching, e.g., reactive ion etching (RIE), using the first $Si_3N_4$ film 12 as a mask.

A first thin amorphous silicon film (a-Si film), a first oxide film ($SiO_2$ film), and a second $Si_3N_4$ film are deposited on an entire surface including the inside of the trench 20 by, e.g., CVD. A resist is formed only in a lower part of the trench 20 to expose the second $Si_3N_4$ film in an upper part of the trench 20. The second $Si_3N_4$ film on surfaces of exposed upper part of the trench 20 and the substrate 10 are selectively removed by etching. Then, the resist is removed from the lower part of the trench 20. Local oxidation of silicon (LOCOS) is executed by using the second $Si_3N_4$ film remained in the lower part of the trench 20 as a mask. Thus, the first a-Si film and the silicon substrate 10 are subjected to LOCOS oxidation so that a collar oxide film 28 is formed in the upper part of the trench 20 and on the first $Si_3N_4$ film 12. Subsequently, the second $Si_3N_4$ film used as the mask for the LOCOS oxidation is removed to expose the silicon substrate 10 at the lower part of the trench 20. Here, the silicon substrate 10 of the lower part of the trench 20 is etched by isotropic etching to enlarge a diameter of the lower part of the trench more than its upper part, if necessary.

A diffusion layer (not shown) is formed in the silicon substrate 10 of the lower part of the trench 20 by, e.g., gas doping. The diffusion layer serves as an electrode for the trench capacitor (DT) to be formed in the trench 20. A dopant may be either p-type or n-type impurity.

Subsequently, the collar oxide film 28 on the surface of the substrate 10 is removed by RIE, and a capacitor dielectric film 30 such as an $Si_3N_4$ film is formed on an entire surface including an inner wall of the trench 20 by, e.g., CVD. Then, the trench 20 is filled with a p-type first polysilicon 32, and the first polysilicon 32 is etched back to a level near a center position of the collar oxide film 28. Thus, a structure shown in FIG. 4A can be formed.

Next, the capacitor dielectric film 30 and the collar oxide film 28 of the inner wall of the trench 20 above the first polysilicon 32 are removed to expose the silicon substrate 10 at upper part of the side wall of the trench 20. An interface film (not shown) such as a very thin SiO2 film or $Si_3N_4$ film is formed on an entire surface, and a p-type second polysilicon 36 is deposited by, e.g., CVD. It should be noted that the second polysilicon 36 could be deposited without forming the interface film. The second polysilicon 36 is etched back and left on the first polysilicon 32 in the trench 20 to contact the side wall of the trench 20.

A third $Si_3N_4$ film 38 and a second a-Si film are deposited on an entire surface by, e.g., CVD. $BF_2$ ions are implanted at an angle from one obliquely direction to dope one side surface and nearly half of the bottom surface of the trench with. The second a-Si film to which no $BF_2$ ions have been doped is only removed by alkaline wet etching, e.g., choline. Thus, the second a-Si film to which $BF_2$ ions have been doped is left only one side face and a part of the bottom surface of the trench.

The left second a-Si is subjected to thermal oxidation to form a second $SiO_2$ film 42. Using the second $SiO_2$ film 42 as a mask, the third $Si_3N_4$ film 38 and the second polysilicon 36 exposed on the bottom surface of the trench are removed by RIE. Thus, a structure shown in FIG. 4B can be formed.

Next, the second $SiO_2$ film 42 used as the mask and the third $Si_3N_4$ film 38 are removed, and a third $SiO_2$ film 44, a fourth $Si_3N_4$ film, and a third a-Si film are deposited on an entire surface by, e.g., CVD. As in the case of the ion implantation described above, $BF_2$ ions are implanted to the third a-Si film on one side face and entire bottom surface of the trench from the same oblique direction of the previous implantation and from a direction right above. Thus, ions are implanted from the same one oblique direction and an upper direction. The third a-Si film to which no $BF_2$ ions have been implanted is removed from the other side face of the trench 20 by wet etching, for example.

By using the left third a-Si film as a mask, the fourth $Si_3N_4$ film exposed in the other side face is removed to expose the third $SiO_2$ film 44. Next, the remaining third a-Si film is removed to expose the fourth $Si_3N_4$ film therebelow. By using the fourth $Si_3N_4$ film as a mask, the third $SiO_2$ film 44 of one side face of the trench 20 is removed to expose the silicon substrate 10 of the side face therebelow.

A gate oxide film 50 is formed by, e.g., thermal oxidation on the exposed silicon substrate 10 of the side face of the trench 20. An n-type or undoped third polysilicon 52 to be formed a gate electrode (GC) is deposited to fill the trench 20. The third polysilicon 52 is etched back to a level close to a center of a thickness of the first $Si_3N_4$ film 12 formed on the surface of the silicon substrate 10. Thus, a structure shown in FIG. 4C can be formed.

Next, an isolation groove for isolating adjacent memory cells in a direction vertical to a paper surface is formed by lithography and etching. As indicated by STI of FIG. 1, the isolation (e.g., shallow trench isolation (STI)) is formed in a direction parallel to the bit line (BL). A depth of the isolation groove can be set to a depth allowing slight etching of an upper surface of the first polysilicon 32 of the trench capacitor (DT), that is a depth indicated by a broken line T-T in FIG. 4D. An isolation insulator such as a $CVD-SiO_2$ film is deposited on an entire surface to fill the isolation groove. A surface of the isolation insulator is planarized by, e.g., CMP using the first $Si_3N_4$ film 12 as a stopper. By the isolation, the memory cells adjacent in the direction vertical to the paper surface are isolated.

The isolation $SiO_2$ film is etched back to expose the surface of the third polysilicon 52. The first $Si_3N_4$ film 12 projecting from the surface is etched by an amount about one half of its thickness to planarize the entire surface.

Subsequently, n-type dopants such as phosphorus (P) are ion-implanted with a high energy, and a source 56 is formed in the silicon substrate 10 so that a part of the source becomes deeper than a level of a bottom of the isolation. The source diffusion layer 56 is also formed below the isolation to become a common source line (WB) within the cell.

A fourth polysilicon 58 that becomes a part of the gate electrode (GC) is deposited on an entire surface by, e.g., CVD, and tungsten (W) 60 is deposited thereon by, e.g., sputtering. Further, a fifth $Si_3N_4$ film 62 is deposited on an entire surface. The fifth $Si_3N_4$ film 62 is patterned to a pattern of the gate electrode (GC) by lithography and etching. By using the fifth $Si_3N_4$ film 62 as a mask, the tungsten 60 and the fourth polysilicon 58 are etched to form a gate electrode (GC). The gate electrode (GC) is formed to cover one side face of the trench 20 having the gate oxide film 50 formed thereon. An area nearly half of the first $Si_3N_4$ film 12 is exposed on the silicon substrate 10 between the trenches 20, and the third $SiO_2$ film 44 formed on the second polysilicon 36 is exposed in the trench 20.

A side wall $SiO_2$ film 64 and a sixth $Si_3N_4$ film 66 are deposited on an entire surface to cover the side face of the gate electrode (GC) by, e.g., CVD. The sixth $Si_3N_4$ film 66 deposited on a horizontal plane is etched by RIE to form a spacer 66 on the side wall of the gate electrode (GC).

By using the gate electrode (GC) as a mask, n-type dopant such as arsenic (As) is ion-implanted to the surface of the silicon substrate 10 to form a drain 68. Thus, a structure shown in FIG. 4D can be formed.

Next, a fifth $SiO_2$ film 70 is deposited on an entire surface by, e.g., CVD to fill a space between the gate electrode (GC)

and the side wall of the trench 20, and a surface thereof is planarized by, e.g., CMP. The fifth SiO$_2$ film 70 on an area in which a bit line contact is to be formed is removed by lithography and etching to expose the first Si$_3$N$_4$ film 12 on the drain 68. After removing the exposed first Si$_3$N$_4$ film 12 to expose the drain 68, a fifth polysilicon 72 is deposited on an entire surface by, e.g., CVD to fill a space between the gate electrodes (GC). A surface of the fifth polysilicon 72 is planarized by, e.g., CMP, and then the fifth polysilicon 72 is recessed so that the fifth Si$_3$N$_4$ film 62 can slightly project.

A sixth SiO$_2$ film 74 is deposited on an entire surface by, e.g., CVD, and then a surface thereof is planarized by, e.g., CMP. A bit line contact hole reaching the fifth polysilicon 72 is formed in the sixth SiO$_2$ film 74 by lithography and etching. The contact hole is filled with an electrode metal such as tungsten (W) to form a contact electrode 76 (CB). Further, a wiring metal such as tungsten (W) is deposited on an entire surface, and a bit line 78 (BL) is formed by lithography and etching. Thus, a structure shown in FIG. 2 can be formed.

Subsequently, a process such as multilevel wiring formation necessary for a semiconductor device is carried out to complete the semiconductor memory device 100 of the embodiment.

As described above, according to the present invention, it can be provided a semiconductor memory device capable of reducing a cell area to 4F$^2$, and excellent in data holding characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a transistor including a source, a drain and a channel region disposed in a semiconductor substrate, and a gate electrode disposed through a gate insulator on a surface of the semiconductor substrate of the channel region;
    a capacitor directly connected to the channel region;
    a first wiring line electrically connected to the gate electrode; and
    a second wiring line electrically connected to the drain.

2. The semiconductor memory device according to claim 1, wherein the capacitor is constituted of a p-type semiconductor, and the source and the drain are constituted of n-type semiconductors.

3. The semiconductor memory device according to claim 2, wherein charges stored in the capacitor are positive.

4. The semiconductor memory device according to claim 3, further comprising a charge injecting unit configured to inject the positive charges into the capacitor by impact ionization due to a source-drain current of the transistor, and a charge extracting unit configured to extract the positive charges from the capacitor and the channel region to the drain by forward biasing the channel region to the drain.

5. The semiconductor memory device according to claim 1, wherein the channel region and the capacitor are in a floating state.

6. The semiconductor memory device according to claim 1, further comprising a common source line connected in common to a plurality of sources in the semiconductor substrate.

7. The semiconductor memory device according to claim 1, wherein charges stored in the capacitor are positive.

8. The semiconductor memory device according to claim 1, wherein the capacitor is disposed in a trench provided in the semiconductor substrate below an intersection point between the first and second wiring lines.

9. The semiconductor memory device according to claim 8, wherein a unit cell of the semiconductor memory device is 4F$^2$ in size, wherein F denotes a critical dimension of lithography.

10. A semiconductor memory device comprising:
    a plurality of trenches disposed in a semiconductor substrate;
    a transistor including a drain, a channel region, and a source disposed in a columnar semiconductor substrate area held between the trenches, and a gate electrode disposed through a gate insulator on one side face of the channel region and disposed in a trench;
    a capacitor directly connected to the other side face of the channel region and disposed in another trench;
    a first wiring line electrically connected to the gate electrode; and
    a second wiring line electrically connected to the drain.

11. The semiconductor memory device according to claim 10, wherein the capacitor is consisted of a p-type semiconductor, and the source and the drain are consisted of n-type semiconductors.

12. The semiconductor memory device according to claim 11, wherein charges stored in the capacitor are positive.

13. The semiconductor memory device according to claim 12, further comprising a charge injecting unit configured to inject the positive charges into the capacitor by impact ionization due to a source-drain current of the transistor, and a charge extracting unit configured to extract the positive charges from the capacitor and the channel region to the drain by forward biasing the channel region to the drain.

14. The semiconductor memory device according to claim 10, wherein a unit cell of the semiconductor memory device is 4F$^2$ in size, wherein F denotes a critical dimension of lithography.

15. The semiconductor memory device according to claim 10, wherein the channel region and the capacitor are in a floating state.

16. The semiconductor memory device according to claim 10, further comprising a common source line connected in common to a plurality of sources in the semiconductor substrate.

17. The semiconductor memory device according to claim 10, wherein charges stored in the capacitor are positive.

18. The semiconductor memory device according to claim 10, wherein the capacitor is disposed in a trench provided in the semiconductor substrate below an intersection point between the first and second wiring lines.

19. The semiconductor memory device according to claim 18, wherein a unit cell of the semiconductor memory device is 4F$^2$ in size, wherein F denotes a critical dimension of lithography.

20. The semiconductor memory device according to claim 1, wherein the capacitor is connected to the semiconductor substrate of the channel region.

* * * * *